United States Patent
Yosui

(10) Patent No.: US 9,832,889 B2
(45) Date of Patent: Nov. 28, 2017

(54) CIRCUIT BOARD AND METHOD FOR PRODUCING SAME

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 205 days.

(21) Appl. No.: 14/623,769

(22) Filed: Feb. 17, 2015

(65) Prior Publication Data

US 2015/0163927 A1 Jun. 11, 2015

Related U.S. Application Data

(63) Continuation of application No. PCT/JP2014/050347, filed on Jan. 10, 2014.

(30) Foreign Application Priority Data

Feb. 14, 2013 (JP) .................. 2013-026341

(51) Int. Cl.
*H05K 3/46* (2006.01)
*B32B 3/26* (2006.01)
(Continued)

(52) U.S. Cl.
CPC ........... *H05K 3/4697* (2013.01); *B32B 3/263* (2013.01); *H05K 1/115* (2013.01); *H05K 1/181* (2013.01);
(Continued)

(58) Field of Classification Search
CPC .............................. H05K 3/4697; B32B 3/263
See application file for complete search history.

(56) References Cited

U.S. PATENT DOCUMENTS 6,833,511 B2* 12/2004 Uchinono .............. H05K 1/119
174/255
9,172,022 B2* 10/2015 Lee ......................... H01L 35/28
(Continued)

FOREIGN PATENT DOCUMENTS

JP  10-200217 A   7/1998
JP  2002-171030 A  6/2002
(Continued)

OTHER PUBLICATIONS

Official Communication issued in International Patent Application No. PCT/JP2014/050347, dated Mar. 11, 2014.

*Primary Examiner* — William H Mayo, III
*Assistant Examiner* — Hiram E Gonzalez
(74) *Attorney, Agent, or Firm* — Keating & Bennett, LLP

(57) ABSTRACT

A circuit board includes a main portion and at least one uneven portion. The main portion is obtained by stacking a plurality of base sheets made of a flexible material in a predetermined direction and subjecting the stacked base sheets to compression bonding. The at least one uneven portion is provided on one of the base sheets. The uneven portion includes a concave portion and a convex portion extending in a direction perpendicular or substantially perpendicular to the predetermined direction. The concave portion is sunken in the predetermined direction. The convex portion protrudes in an opposite direction to the predetermined direction.

8 Claims, 11 Drawing Sheets

(51) Int. Cl.
*H05K 1/11* (2006.01)
*H05K 1/18* (2006.01)
*H05K 1/02* (2006.01)

(52) U.S. Cl.
CPC .............. *H05K 1/182* (2013.01); *H05K 1/186* (2013.01); *H05K 3/4617* (2013.01); *B32B 2457/08* (2013.01); *H05K 1/0271* (2013.01); *H05K 3/4632* (2013.01); *H05K 2201/0141* (2013.01); *H05K 2201/091* (2013.01); *H05K 2201/09781* (2013.01); *H05K 2201/09909* (2013.01); *Y10T 29/49126* (2015.01); *Y10T 428/24612* (2015.01)

(56) References Cited

U.S. PATENT DOCUMENTS

| | | | | |
|---|---|---|---|---|
| 2004/0160751 | A1* | 8/2004 | Inagaki | H01L 21/4857 361/763 |
| 2004/0168825 | A1* | 9/2004 | Sakamoto | H01L 21/4846 174/260 |
| 2007/0116932 | A1* | 5/2007 | Van Der Tempel | G02F 1/133305 428/172 |
| 2007/0209831 | A1* | 9/2007 | Sakamoto | H01L 21/568 174/262 |
| 2009/0154132 | A1* | 6/2009 | Okamoto | H01L 23/5389 361/804 |
| 2012/0181068 | A1 | 7/2012 | Kato et al. | |

FOREIGN PATENT DOCUMENTS

| | | |
|---|---|---|
| JP | 2009-004709 A | 1/2009 |
| JP | 2009-239088 A | 10/2009 |
| WO | 2011/040393 A1 | 4/2011 |

* cited by examiner

F I G. 3A
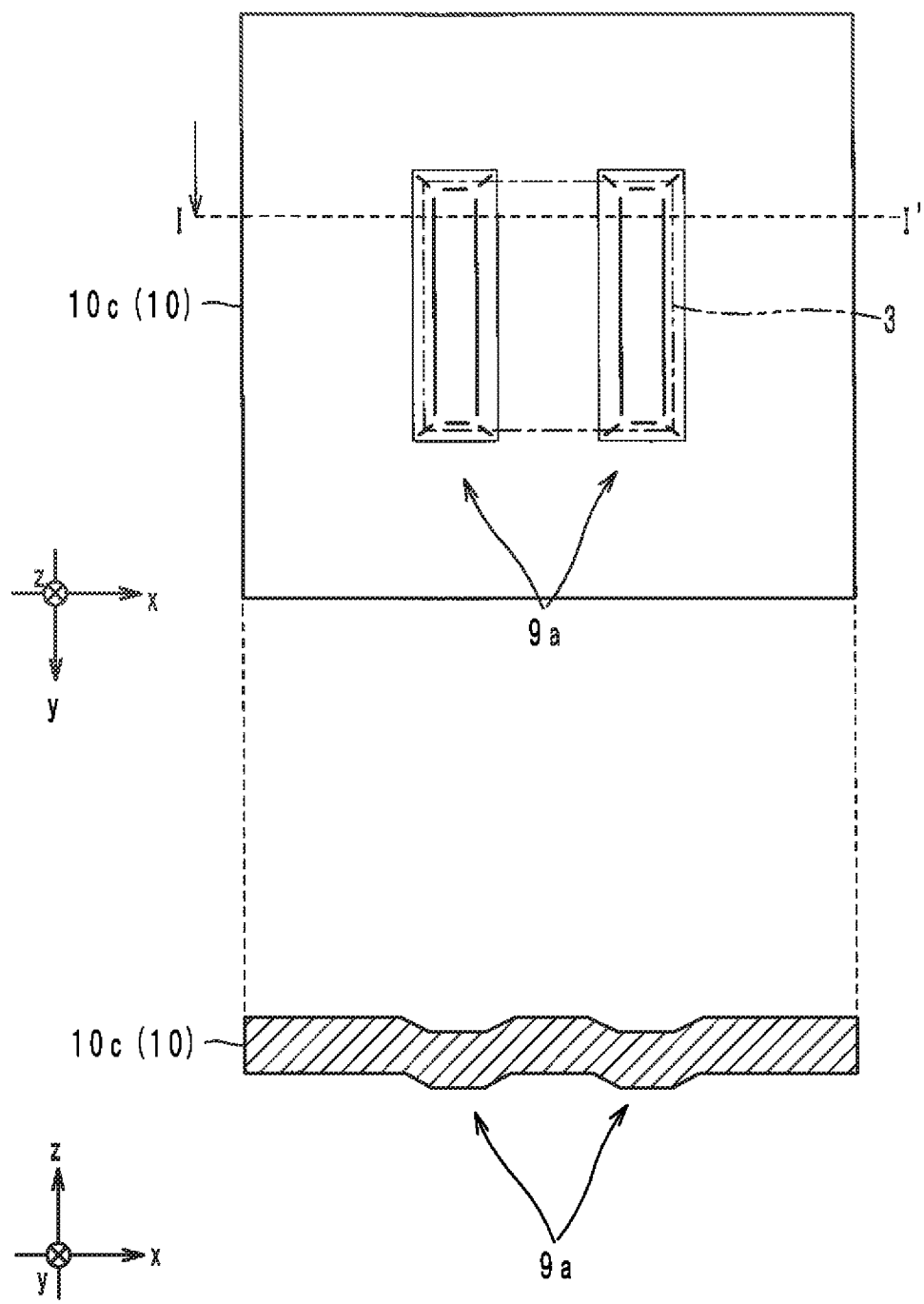

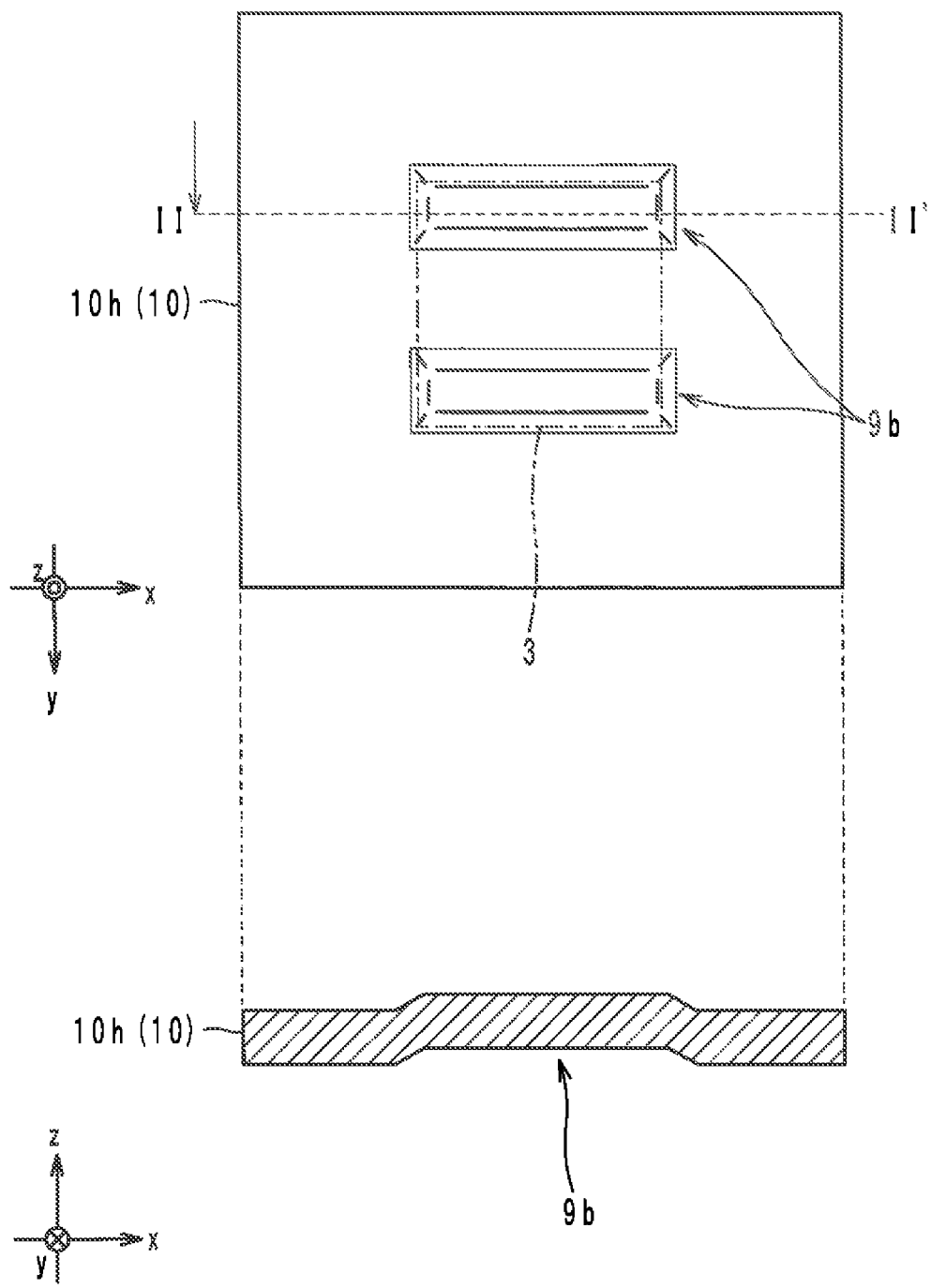

F I G . 6
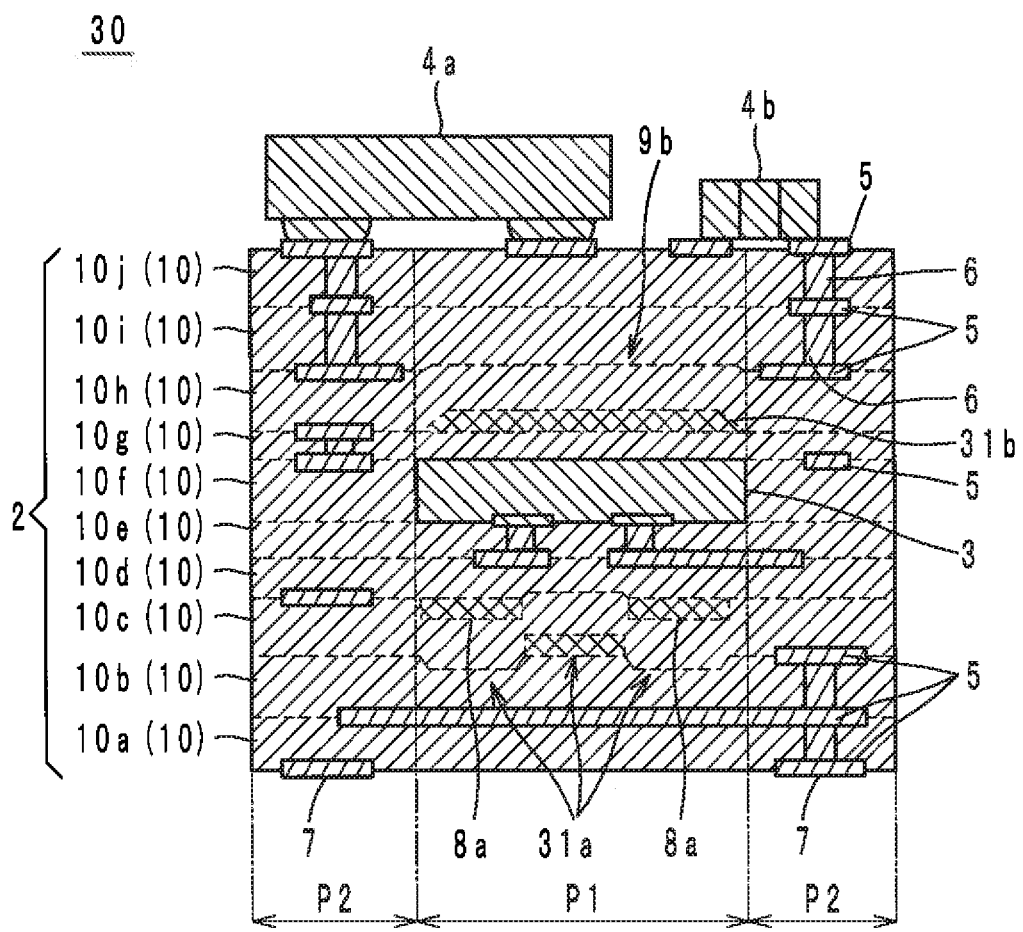

CIRCUIT BOARD AND METHOD FOR PRODUCING SAME

This application is based on Japanese Patent Application No. 2013-026341 filed on Feb. 14, 2013, and International Application No. PCT/JP2014/050347 filed on Jan. 10, 2014, the entire contents of each of which is incorporated herein by reference.

BACKGROUND OF THE INVENTION

1. Field of the Invention

The present invention relates to a circuit board including a first portion relatively resistant to deformation and a second portion more flexible and less resistant to deformation than the first portion, and also relates to a method for producing such a circuit board.

2. Description of the Related Art

An example of a conventional circuit board of this type is described in International Publication No. WO 2011/040393. In International Publication No. WO 2011/040393, the circuit board includes a main portion obtained by stacking base sheets made of a flexible material (e.g., polyimide or liquid crystal polymer). The main portion includes a first portion relatively resistant to deformation and a second portion more flexible and less resistant to deformation than the first portion. The main portion has provided therein wiring conductors for electrically connecting an electronic component and various electrodes and reinforcing insulation films made of a more rigid material (e.g., epoxy resin) than the base sheets. The first portion is formed by providing the reinforcing insulation films so as to, when viewed in a plan view in the stacking direction of the base sheets, cover areas where the base sheets are not desired to be deformed.

The above conventional circuit board uses the reinforcing insulation films to form the first portion. However, the reinforcing insulation films are made of a different material from that of the base sheets, and therefore, affect the characteristics (such as low relative permittivity, low loss, and low water absorption) of the main portion, which is a stack of base sheets. Moreover, the reinforcing insulation films of such a different material are formed so as to be relatively large in area, and therefore, there is difficulty in ensuring bonding strength between the reinforcing insulation films and the base sheets.

SUMMARY OF THE INVENTION

One aspect of various preferred embodiments of the present invention is directed to a circuit board including a main portion and at least one uneven portion. The main portion is obtained preferably by stacking a plurality of base sheets made of a flexible material in a predetermined direction and subjecting the stacked base sheets to compression bonding. The at least one uneven portion is provided on at least one of the base sheets. The uneven portion includes a concave portion and a convex portion extending in a direction perpendicular or substantially perpendicular to the predetermined direction. The concave portion is sunken in the predetermined direction. The convex portion protrudes in an opposite direction to the predetermined direction.

Another aspect of various preferred embodiments of the present invention is directed to a method for producing a circuit board. The method preferably includes the steps of preparing a plurality of base sheets made of a flexible material; and stacking the base sheets in a predetermined direction, subjecting the stacked base sheets to compression bonding, and forming an uneven portion on at least one of the base sheets, the uneven portion extending in a direction perpendicular or substantially perpendicular to the predetermined direction. The uneven portion includes a concave portion and a convex portion extending in the direction perpendicular or substantially perpendicular to the predetermined direction, the concave portion being sunken in the predetermined direction, the convex portion protruding in an opposite direction to the predetermined direction.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A is a diagram schematically illustrating a first uneven portion in FIG. 1.

FIG. 3B is a diagram schematically illustrating a second uneven portion in FIG. 1.

FIG. 6 is a vertical cross-sectional view of a circuit board according to a modification of a preferred embodiment of the present invention.

DETAILED DESCRIPTION OF THE PREFERRED EMBODIMENTS

First, x-, y-, and z-axes in the figures will be described. The x-, y-, and z-axes are perpendicular or substantially perpendicular to one another. The z-axis represents a stacking direction of base sheets. For the sake of convenience, the positive and negative sides of the z-axis are defined as the top and bottom sides, respectively. Moreover, the x-axis indicates the left to right direction of the base sheets. More specifically, the positive and negative sides of the x-axis are defined as the right and left sides, respectively. Furthermore, the y-axis indicates the rear to forward direction of the base sheets. More specifically, the positive and negative sides of the y-axis are defined as the back and front sides, respectively.

Figure 1:
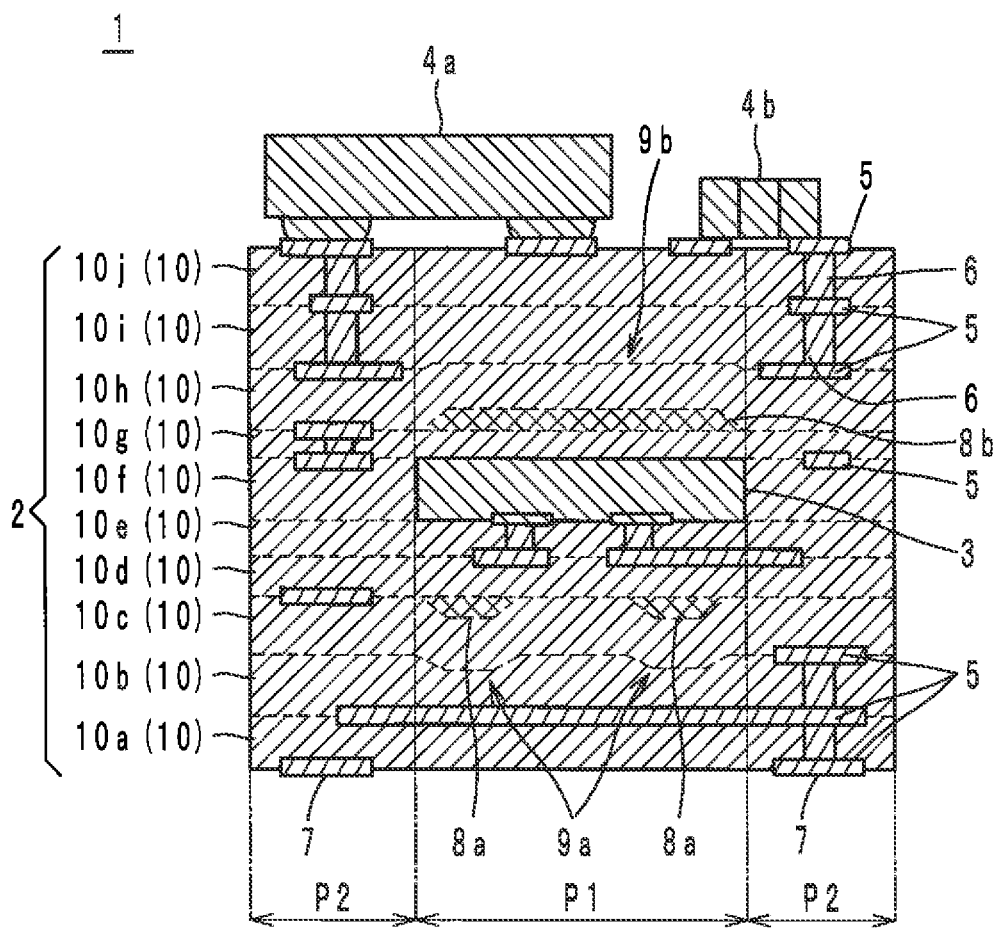
FIG. 1 is a vertical cross-sectional view of a circuit board according to a preferred embodiment of the present invention.

FIG. 1 is a view illustrating a vertical cross-section of a circuit board according to a preferred embodiment of the present invention. In FIG. 1, the circuit board 1 includes a main portion 2, at least one internal electronic component (referred to below as an internal component) 3, at least one surface-mount electronic component (referred to below as a surface-mount component) 4, a plurality of pattern conductors 5, a plurality of via-conductors 6, and a plurality of external electrodes 7.

The main portion 2 includes a stack of thermoplastic base sheets 10 (in the figure, first through tenth base sheets 10a to 10j are shown) preferably subjected to compression bonding. In FIG. 1, the interface between every two adjacent base sheets 10 in the z-axis direction is indicated by an imaginary long-dashed short-dashed line. The base sheets 10 are made of a flexible material which provides electrical insulation (e.g., a thermoplastic resin such as polyimide or liquid crystal polymer). Liquid crystal polymer is particularly preferable as a material for the base sheets 10 because it offers a low relative permittivity, a low loss, and low water absorption. Moreover, the base sheets 10 preferably have the same or substantially the same rectangular or substantially rectangular shape when viewed in a plan view from the positive side of the z-axis, and also have a thickness of, for example, from about 10 μm to about 100 μm.

The base sheet 10a is the closest to a mother board (not shown) when the circuit board 1 is mounted on the mother board. The external electrodes 7 are formed of a conductive material, such as copper, on the bottom surface of the base sheet 10a so as to correspond to the positions of land electrodes on the mother board.

Furthermore, the via-conductors 6 are provided in the base sheet 10a. For example, the via-conductors 6 are made of a conductive material such as an alloy of tin and silver. The via-conductors 6 are used to electrically connect an electronic circuit, which includes the internal component 3 and the surface-mount component 4, to the mother board. The via-conductors 6 pierce through the base sheets 10 in the z-axis direction. Note that in FIG. 1, to avoid complexities of the figure, the reference numeral "6" is assigned only to some of the via-conductors.

The base sheets 10b to 10j are stacked respectively on their corresponding upper principal surfaces of the base sheets 10a to 10i. Among the above base sheets, the base sheets 10b to 10e have pattern conductors 5 formed of a conductive material, such as copper, on their lower principal surfaces. On the other hand, the base sheets 10f to 10i have similar pattern conductors 5 provided on their upper principal surfaces. More specifically, the pattern conductors 5 are formed of a conductive material including copper or silver and having a low specific resistance, by patterning a conductor film firmly fixed to a large-sized base sheet (i.e., metal foil attached to one side of the sheet). The pattern conductors 5 define and serve as wiring conductors of the electronic circuit, including the internal component 3 and the surface-mount component 4, and also define and serve as electrodes of capacitors and inductors included in the electronic circuit. Moreover, another example of the pattern conductor 5 is a ground conductor of the electronic circuit. FIG. 1 shows a pattern conductor 5 defining and serving as a ground conductor provided on the lower principal surface of the base sheet 10b. Further, a plurality of land electrodes for use in mounting the surface-mount component 4 are provided on the upper principal surface of the base sheet 10j as pattern conductors 5.

Each pattern conductor 5 is electrically connected as necessary to, for example, another pattern conductor 5 located on a different base sheet 10 through at least one via-conductor 6. Note that to avoid complexities of FIG. 1, the reference numeral "5" is assigned only to some of the pattern conductors.

Furthermore, in the present preferred embodiment, the base sheet 10f, when viewed in a plan view in the z-axis direction (referred to below as "in a top view"), includes a cavity C (see FIG. 4A) provided in its center in order to accommodate the internal component 3 during the production process to be described later.

The internal component 3 is preferably an IC chip. A non-limiting example of an IC chip of this type is a secure IC chip incorporating an EEPROM and being capable of storing various types of information.

The surface-mount component 4 is, for example, an IC chip or a passive component. A non-limiting example of an IC chip of this type is an RF IC chip 4a for use in 13.56-MHz band NFC (Near Field Communication). Another non-limiting example of the surface-mount component 4 is a chip capacitor 4b configured to define a resonant circuit along with an antenna coil included in the RF IC chip 4a. The surface-mount component 4 as above is mounted on the land electrodes on the upper principal surface of the base sheet 10i using a conductive, bonding material such as solder.

In the present preferred embodiment, the internal component 3 and the surface-mount component 4 are described as a secure IC chip and an RF IC chip 4a, respectively, but instead of this, the internal component 3 and the surface-mount component 4 may be an RF IC chip 4a and a secure IC chip, respectively.

Here, to prevent the internal component 3 from cracking and also to ensure reliable joints between the internal component 3 and the via-conductors 6, etc., it is preferable that the main portion 2 be relatively resistant to deformation in portions above and/or below the internal component 3. From this viewpoint, the circuit board 1 includes at least one set of auxiliary members 8.

In the present preferred embodiment, the circuit board 1 includes two sets of auxiliary members 8, i.e., first and second sets of auxiliary members 8a and 8b, as shown in, for example, FIG. 1. The auxiliary members 8a and 8b are preferably made of a material having a softening initiation temperature (about 255° C. to about 330° C., for example) such that they are neither softened nor fluidized at the softening initiation temperature (about 250° C. to about 300° C., for example) of the base sheets 10. Examples of such a material include a similar conductive material to that of the pattern conductor 5 and a thermosetting resin such as epoxy. Aside from this, the auxiliary members 8a and 8b may be made of the same flexible material (e.g., liquid crystal polymer) as the base sheets 10 so long as the material has a softening initiation temperature such that it is not softened at the softening initiation temperature of the base sheets 10. Here, if the base sheets 10 and the auxiliary members 8 are made of different materials, the auxiliary members 8 might affect the characteristics of the main portion 2. Accordingly, the auxiliary members 8 are preferably made of the same material as the base sheets 10, and therefore, essentially do not affect the characteristics of the main portion 2. Even if the base sheets 10 and the auxiliary members 8 are made of different materials, the auxiliary members occupy relatively smaller areas, and therefore, barely affect the characteristics of the main portion 2 from 8p inside.

Each set of the auxiliary members 8 are members configured to provide a wave-shaped configuration to at least one of the base sheets 10 at the time of compression bonding of the base sheets 10. In the present preferred embodiment, the auxiliary members 8a and 8b are configured to provide a wave-shaped configuration to the base sheets 10c and 10h.

Figure 2:
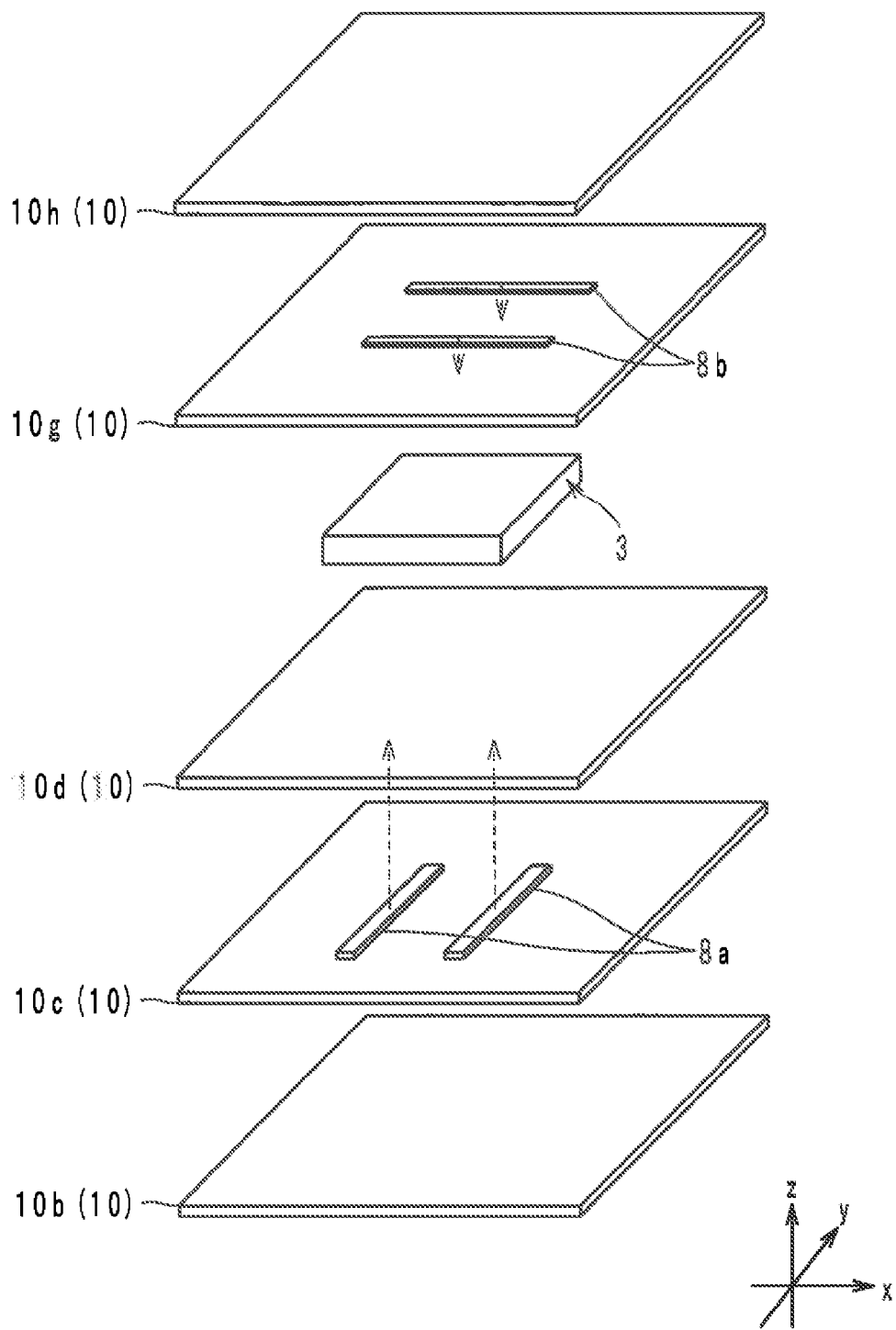
FIG. 2 is an oblique view schematically illustrating auxiliary members in FIG. 1.

The auxiliary members 8a preferably are strip-shaped sheet members provided on the lower principal surface of the base sheet 10d prior to compression bonding, as indicated by arrows in FIG. 2. The width of each strip-shaped sheet member in the x-axis direction preferably is from about 20 μm to about 500 μm, for example. In addition, the thickness of the sheet member in the z-axis direction is from about 5 µm to about 100 µm, for example. Further, the length of the sheet member in the y-axis direction is preferably the same or approximately the same as, for example, the dimension of the internal component 3 in the y-axis direction. The strip-shaped sheet members extend in the y-axis direction and are spaced apart in the x-axis direction. Here, the interval between the strip-shaped sheet members is determined by the number of strip-shaped sheet members and other factors, but in the present preferred embodiment, the interval is assumed to be the same or approximately the same as the dimension of the internal component 3 in the x-axis direction.

Furthermore, the auxiliary members 8b preferably are strip-shaped sheet members provided on the lower principal surface of the base sheet 10h prior to compression bonding, as indicated by arrows in FIG. 2. The strip-shaped sheet members preferably have the same or approximately the same size as the strip-shaped sheet members that serve as the auxiliary members 8a. However, unlike the strip-shaped sheet members that define and serve as the auxiliary members 8a, the strip-shaped sheet members that define and serve as the auxiliary members 8b extend in the x-axis direction and are spaced apart in the y-axis direction. Here, the interval between the strip-shaped sheet members is determined in the same manner as described above, but in the present preferred embodiment, the interval is preferably the same or substantially the same as the dimension of the internal component 3 in the y-axis direction.

FIG. 3A is a diagram schematically illustrating a first uneven portion 9a shown in FIG. 1. More specifically, the uneven portion 9a as viewed from the negative side in the z-axis direction is shown in the upper portion, and the uneven portion 9a as viewed from the negative side in the y-axis direction is shown in the lower portion. The base sheet 10c is provided with the uneven portion 9a, which preferably has a wave-shaped configuration when viewed in a plan view in the y-axis direction defined by the auxiliary members 8a at the time of compression bonding, as shown in FIG. 3A. More specifically, the base sheet 10c includes concave and convex portions extending in the y-axis direction, as shown in FIG. 3A. The concave portion is sunken, for example, toward the positive end in the z-axis direction. In this case, the convex portions protrude toward the negative end in the z-axis direction. To describe it in more detail, the base sheet 10c, when viewed from the negative side in the z-axis direction, includes one concave portion between two convex portions. Moreover, in the present preferred embodiment, the uneven portion 9a is configured such that the outline of the internal component 3 indicated by long-dashed short-dashed lines in the figure is kept within the outline of the uneven portion 9a when viewed in a plan view in the z-axis direction.

FIG. 3B is a diagram schematically illustrating a second uneven portion 9b shown in FIG. 1. More specifically, the uneven portion 9b as viewed from the positive side in the z-axis direction is shown in the upper portion, and the uneven portion 9b as viewed from the negative side in the x-axis direction is shown in the lower portion. The base sheet 10h is provided with the uneven portion 9b, which preferably has a wave-shaped configuration when viewed in a plan view in the y-axis direction defined by the auxiliary members 8b at the time of compression bonding, as shown in FIG. 3B. More specifically, the base sheet 10h includes concave and convex portions extending in the x-axis direction, as shown in FIG. 3B. The concave portion is sunken, for example, toward the positive end in the z-axis direction. In this case, the convex portions protrude toward the negative end in the z-axis direction. To describe it in more detail, the base sheet 10h, when viewed from the negative side in the z-axis direction, includes one concave portion between two convex portions. Moreover, in the present preferred embodiment, the uneven portion 9b is configured such that the outline of the internal component 3 indicated by long-dashed short-dashed lines in the figure is kept within the outline of the uneven portion 9b when viewed in a plan view in the z-axis direction.

Next, a non-limiting example of a method for producing the circuit board 1 will be described with reference to FIGS. 4A to 4C. In the following, the process of producing one circuit board 1 will be described, but in actuality, large-sized base sheets are preferably stacked and cut, thus producing a large number of circuit boards 1 at the same time.

Prepared first are a necessary number of large-sized base sheets with their top surfaces copper-foiled almost entirely. The large-sized base sheets define and serve as base sheets 10 upon completion of a circuit board 1. To produce the circuit board shown in FIG. 1, large-sized base sheets (see FIG. 4A) corresponding to the base sheets 10a to 10j are prepared. The large-sized base sheets will be denoted below by the reference characters 10a to 10j corresponding to the base sheets 10a to 10j. The large-sized base sheets 10a to 10j are sheets of liquid crystal polymer, each having a thickness of, for example, about 10 µm to about 100 µm. The thickness of the copper foil is, for example, about 3 µm to about 30 µm. Note that the copper-foiled surfaces are preferably smoothened, for example, by galvanization for rust prevention.

Figure 4A:
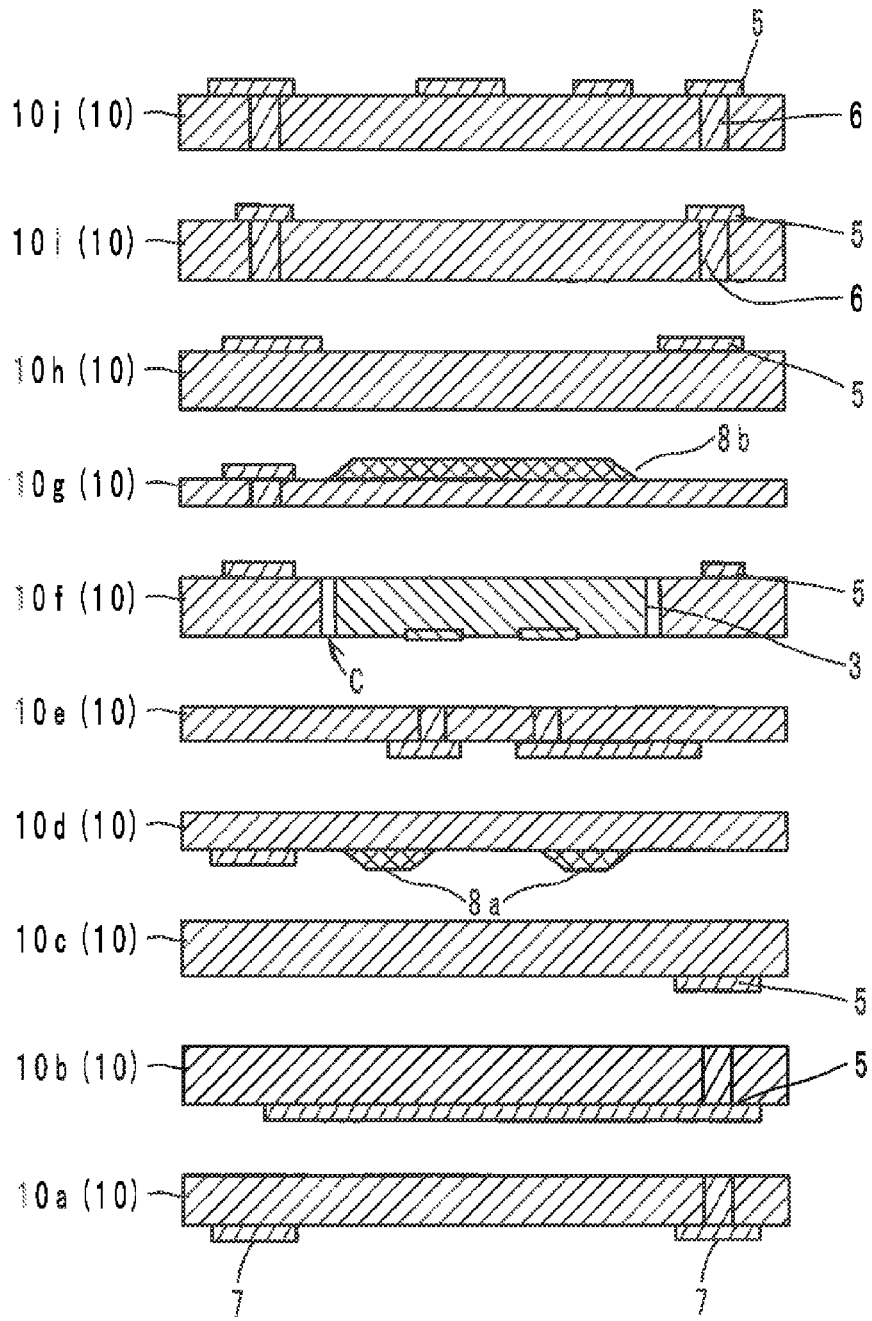
FIG. 4A is a schematic view illustrating a first portion of a method for producing the circuit board in FIG. 1.

Next, as shown in FIG. 4A, a plurality of external electrodes 7 are formed on one principal surface (in FIG. 4A, the lower principal surface) of the large-sized base sheet 10a by patterning the copper foil on that principal surface. Similarly, pattern conductors 5 (i.e., wiring conductors and various electrodes) are formed on one principal surface (in FIG. 4A, the lower principal surface) of each of the large-sized base sheets 10b to 10e. Likewise, pattern conductors 5 are formed on one principal surface (in FIG. 4A, the upper principal surface) of each of the large-sized base sheets 10f to 10j.

Next, auxiliary members 8a are formed by printing on one principal surface (in FIG. 4A, the lower principal surface) of the large-sized base sheet 10d using a resin paste containing resin such as epoxy resin. Similarly, auxiliary members 8b are formed by printing on one principal surface (in FIG. 4A, the upper principal surface) of the large-sized base sheet 10g.

Next, the large-sized base sheet 10a is irradiated with laser beams in positions where via-conductors 6 are to be formed, on the side without the external electrodes 7 (i.e., on the upper principal surface). As a result, through-holes are configured so as to pierce through the large-sized base sheet 10a but not through the external electrodes 7, and thereafter, each through-hole is filled with a conductive paste.

Similarly, each of the large-sized base sheets 10b to 10e is irradiated with laser beams in positions where via-conductors 6 are to be formed, on the side without the pattern conductors 5 (i.e., on the upper principal surface). Each of the resultant through-holes is filled with a conductive paste. Likewise, through-holes are provided in predetermined positions in the large-sized base sheets 10f to 10j, and thereafter, each through-hole is filled with a conductive paste.

Next, an internal component 3 is placed in a predetermined position on one principal surface (e.g., the lower principal surface) of the large-sized base sheet 10g. Moreover, the area of the large-sized base sheet 10f that corresponds to the position of the internal component 3 is punched out using a punching die, such that a through-hole to define and serve as a cavity C is provided.

Figure 4B:
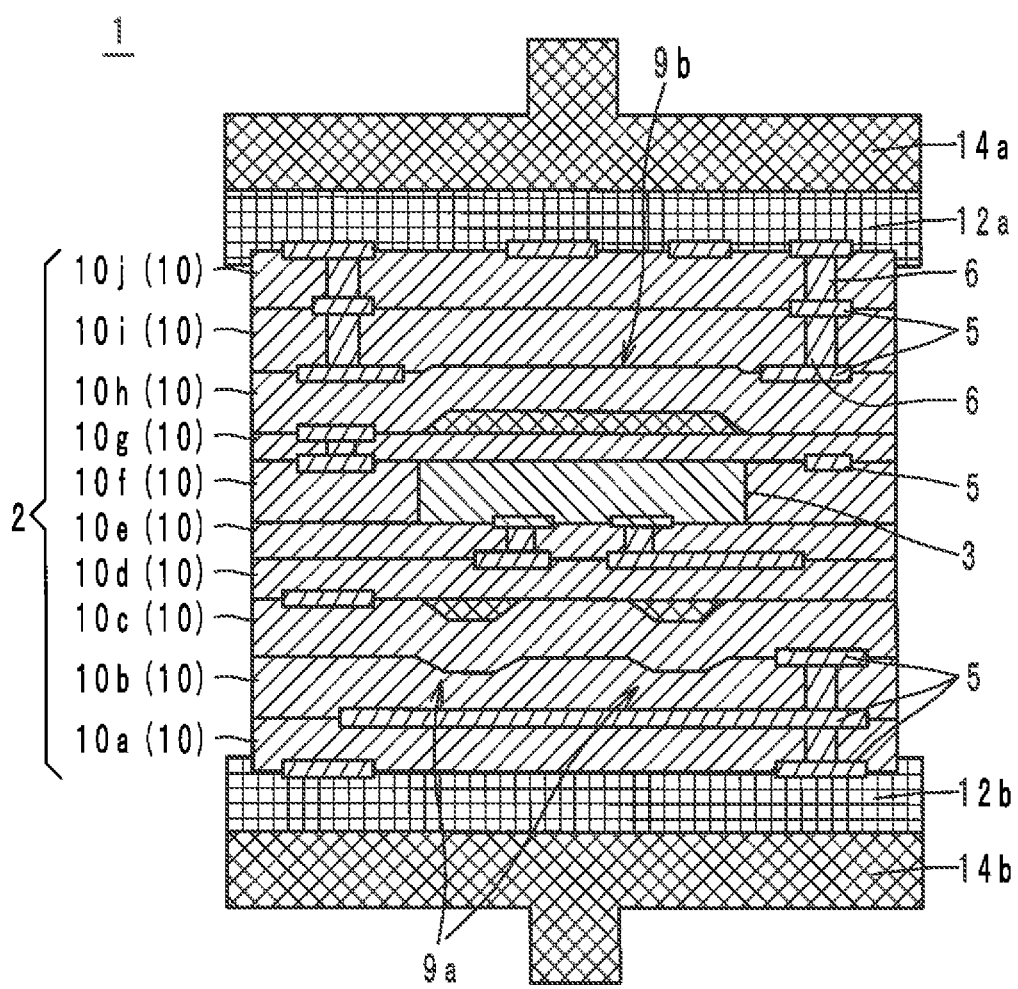
FIG. 4B is a schematic view illustrating a second portion of the method for producing the circuit board in FIG. 1.

Next, the large-sized base sheets 10a to 10j are stacked in this order from bottom to top, as shown in FIG. 4B. Here, the large-sized base sheets 10a to 10e are stacked such that the surfaces with the external electrodes 7 and the pattern conductors 5 face down, and the large-sized base sheets 10f to 10j are stacked such that the surfaces with the pattern conductors 5 face up.

Thereafter, the stacked large-sized base sheets 10a to 10j are heated (at about 300° C.) and pressed from both sides in the z-axis direction. The heating and the pressing soften and bond the large-sized base sheets 10a to 10j, thus integrating them. At the same time, the conductive paste in each via-hole is solidified so that via-conductors 6 are formed.

Here, in the stacked large-sized base sheets 10a to 10j, the auxiliary members 8a are located on the lower principal surface of the base sheet 10d. The auxiliary members 8a are neither softened nor fluidized by heat and pressure applied at the time of compression bonding. The internal component 3, which is also not softened by such heat and pressure, is disposed above the auxiliary members 8a with the base sheet 10e positioned therebetween. Accordingly, when the stack is pressed on both sides in the vertical direction, the auxiliary members 8a receive a significant downward force via the internal component 3. As a result, the base sheet 10c protrudes downward by being pressed by the auxiliary members 8a. Therefore, as described earlier, the base sheet 10c is changed into a wave-shaped configuration when viewed in a plan view in the y-axis direction, thus forming an uneven portion 9a. Likewise, the base sheet 10h is changed by similar action into a wave-shaped configuration when viewed in a plan view in the x-axis direction, thus forming an uneven portion 9b.

Figure 4C:
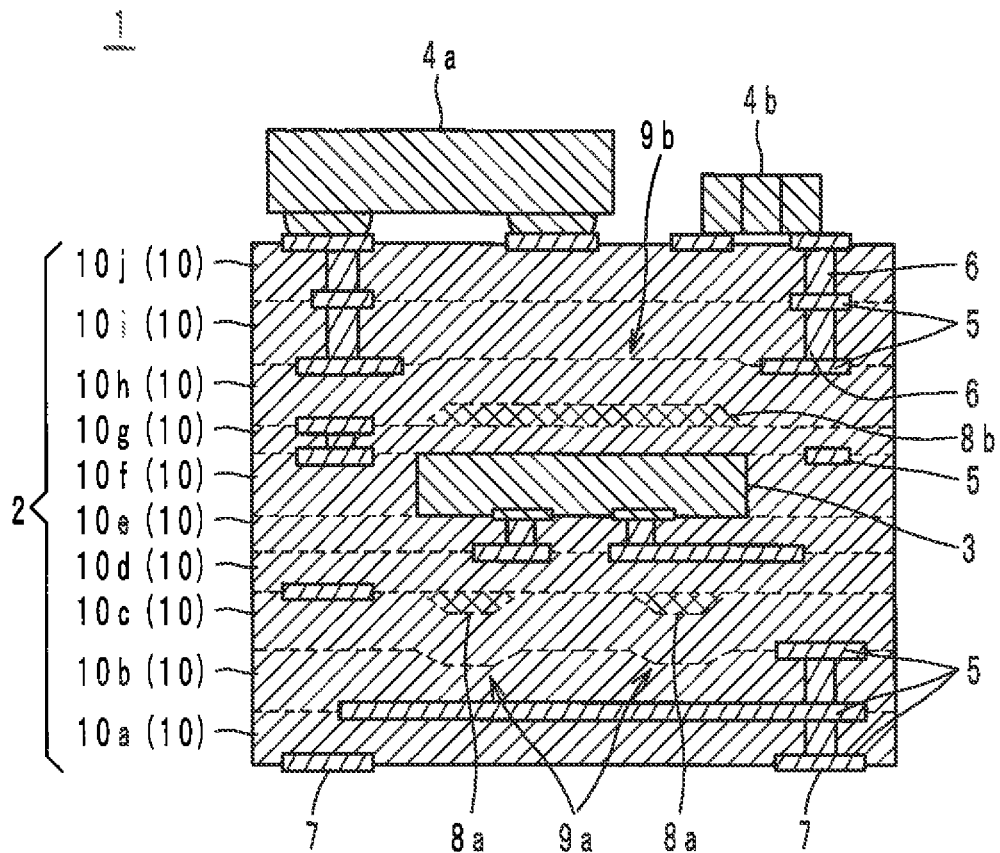
FIG. 4C is a schematic view illustrating a third portion of the method for producing the circuit board in FIG. 1.

After the compression bonding process as described above, surface-mount components 4 are mounted on land electrodes of the large-sized base sheet 10j by reflow soldering or other suitable process, as shown in FIG. 4C. Thereafter, the integrated large-sized base sheets 10a to 10j are cut into a predetermined size, such that a circuit board 1 is completed.

As described above, in the present preferred embodiment, the base sheets 10c and 10h respectively including the uneven portions 9a and 9b in a wave-shaped configuration are provided above and below the internal component 3 within the main portion 2. The uneven portion 9a extends along the y-axis and therefore is resistant to bending by a bending moment that causes a turn about the x-axis. The uneven portion 9b extends along the x-axis and therefore is resistant to bending by a bending moment that causes a turn about the y-axis.

Accordingly, the main portion 2 includes a first portion P1 relatively resistant to bending deformation, which includes areas inside and around the outline of the internal component 3 when viewed in a plan view in the z-axis direction, as shown in FIG. 1. On the other hand, the main portion 2 includes a second portion P2, which is flexible and relatively less resistant to deformation and includes areas other than the first portion P1.

Furthermore, the main portion 2 is made of a material, such as polyimide or liquid crystal polymer, which offers a low relative permittivity, a low loss, and low water absorption. Moreover, the main portion 2 can be formed without a material, such as epoxy resin, which affects the relative permittivity, loss, and water absorption of the base sheets 10, being used in a large area. Therefore, it is possible to provide a circuit board 1 capable of taking full advantage of the characteristics of the base sheets 10 (such as low relative permittivity, low loss, low water absorption, and adhesion between the base sheets), and it is also possible to provide a method for producing the same.

Furthermore, there is almost no need to dispose any elements other than the pattern conductors 5 required for the electronic circuit, between every adjacent base sheets 10 in the z-axis direction within the main portion 2. In other words, the main portions of the base sheets 10 are bonded to the same material, so that bonding strength is increased compared to conventional circuit boards.

Furthermore, as shown in FIG. 1, the position of the base sheet 10c in the z-axis direction is designed to be closer to the internal component 3 than to the lower principal surface of the base sheet 10a. Therefore, in the present preferred embodiment, the thickness of the base sheets 10d and 10e in the z-axis direction is less than the thickness of the base sheets 10a and 10b in the z-axis direction. Accordingly, a relatively significant force is applied to the auxiliary members 9a, so that the uneven portion 9a is formed readily. From the same viewpoint, the position of the base sheet 10h in the z-axis direction is designed to be closer to the internal component 3 than to the upper principal surface of the base sheet 10j.

Figure 5:
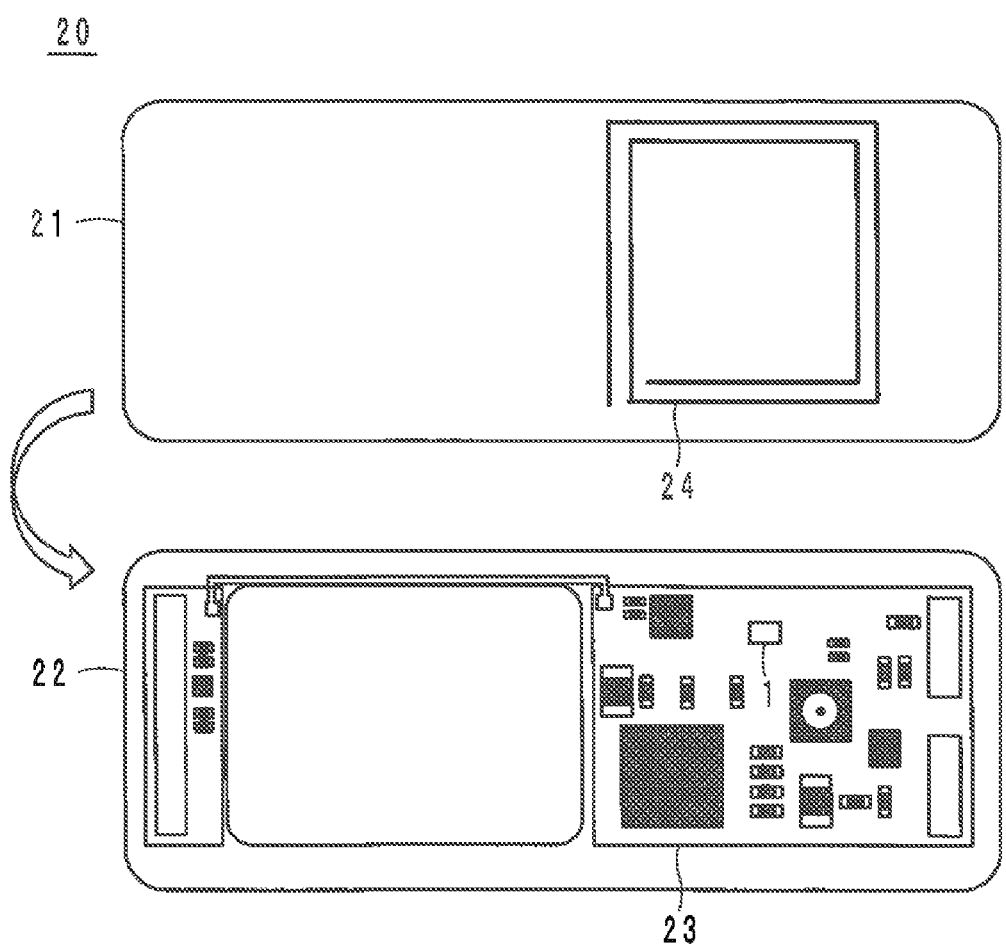
FIG. 5 is a diagram illustrating a communication terminal device to which the circuit board shown in FIG. 1 is applied.

FIG. 5 is a schematic diagram illustrating the configuration of a communication terminal device 20 to which the circuit board 1 in FIG. 1 is applied. In FIG. 5, the communication terminal device 20 preferably is configured to be capable of contactless communication by a 13.56-MHz band RFID (Radio Frequency Identification) system, for example. An example of such an RFID system is NFC (Near Field Communication).

FIG. 5 shows various components and members disposed in a housing 22 of the communication terminal device 20 with its housing cover 21 open. The communication terminal device 20 is typically a cell phone or a smartphone, and includes a printed-wiring board 23, which has the circuit board 1 mounted thereon, and a booster antenna 24 within the housing 22. In addition to these, a battery pack, a camera, a UHF antenna, and various circuit elements preferably are mounted and arranged in high density within the housing 22, but they are not indispensable features to the present invention, and therefore, any descriptions thereof will be omitted.

Furthermore, the booster antenna 24 is attached to the housing cover 21 so as to be situated above an antenna coil of the surface-mount component 4a when the housing cover 21 is closed. The booster antenna 24 is, for example, a planar spiral coil or the like, and is configured in order to extend the communication distance of the antenna coil.

The circuit board 1 includes various components integrated therein, including the internal component 3 and the surface-mount component 4b (see FIG. 1). Accordingly, it is possible to reduce transmission loss and unnecessary electromagnetic coupling due to long wiring in the communication terminal device 20. Further, it is possible to downsize the space in which to mount the components.

While the foregoing has been given with respect to an application example to the 13.56-MHz band RFID system, this is not limiting, and aside from that, the circuit board 1 can also be applied to wireless communication systems using the UHF band, such as a wireless LAN, and other purposes.

Modification

Figure 7:
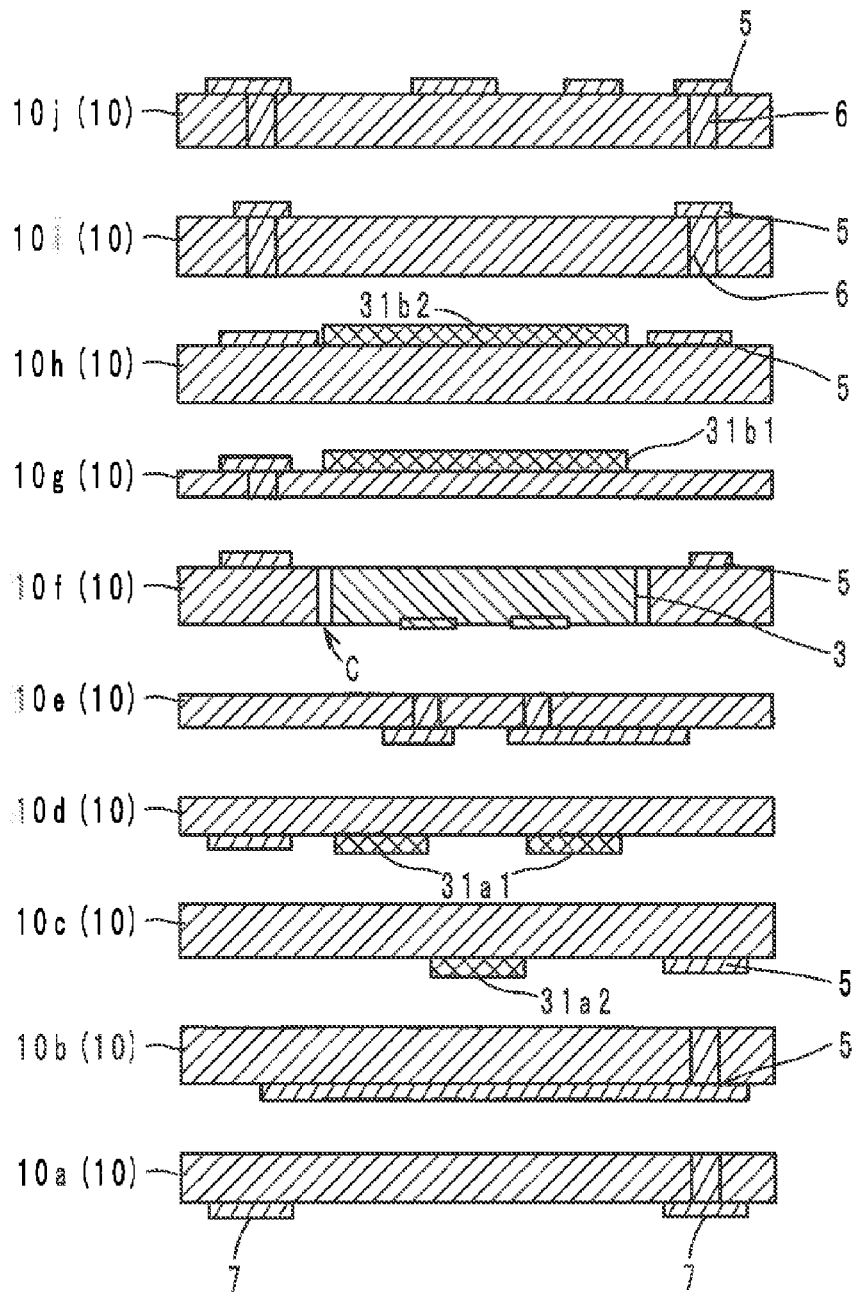
FIG. 7 is an oblique view of the circuit board in FIG. 6 separated into its individual base sheets.

FIG. 6 is a vertical cross-sectional view of a circuit board 30 according to a modification of a preferred embodiment of the present invention. FIG. 7 is a vertical cross-sectional view illustrating a main portion 2 in FIG. 6 separated into its individual base sheets 10. In FIGS. 6 and 7, the circuit board 30 differs from the circuit board 1 shown in FIGS. 1 and 2 in that auxiliary members 31 are provided in place of the auxiliary members 8, and uneven portions 9 are shaped differently from their equivalents. There are preferably no other differences between the circuit boards 1 and 30. Therefore, in FIGS. 6 and 7, elements corresponding to those shown in FIGS. 1 and 2 are denoted by the same reference characters, and any descriptions thereof will be omitted.

Each set of auxiliary members 31 are members configured to provide a wave-shaped configuration to at least one base sheet 10 at the time of compression bonding of base sheets 10. In the present modification, auxiliary members 31a and 31b are provided in order to provide a wave-shaped configuration to the base sheets 10c and 10h.

Figure 8:
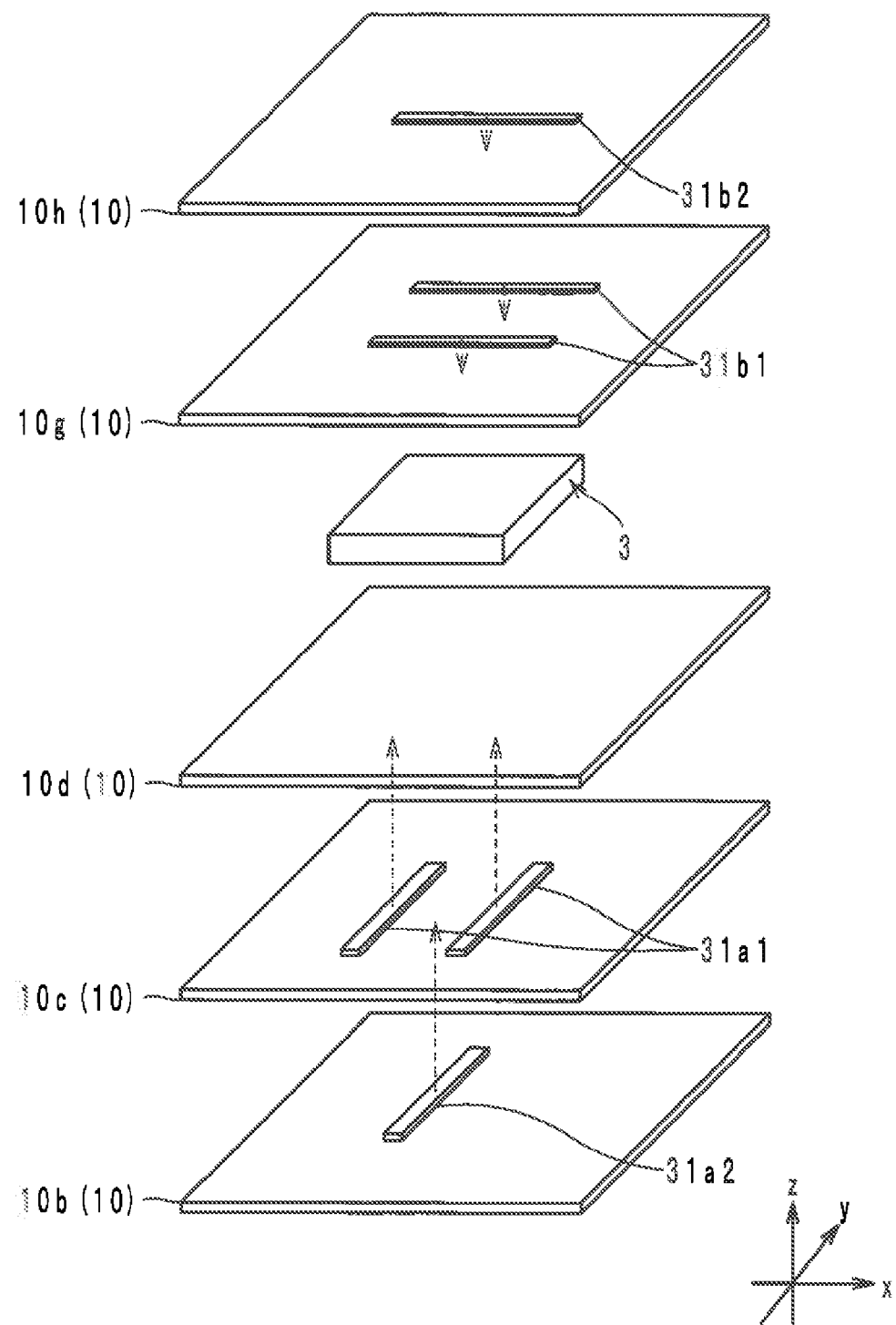
FIG. 8 is an oblique view schematically illustrating auxiliary members in FIG. 6.

In the present modification, the auxiliary members 31a include a plurality of strip-shaped sheet members 31a1 and at least one strip-shaped sheet member 31a2, as shown in FIG. 8. The strip-shaped sheet members 31a1 and 31a2 are typically sheets of liquid crystal polymer having a higher softening initiation temperature than the liquid crystal polymer of the base sheets 10. The strip-shaped sheet members 31a1 and 31a2 are provided respectively on their corresponding lower principal surfaces of the base sheets 10d and 10c prior to compression bonding. The strip-shaped sheet members 31a1 extend in the y-axis direction and are spaced apart in the x-axis direction. The interval between the strip-shaped sheet members 31a1 is determined by the number of strip-shaped sheet members and other factors, but in the present modification, the interval is preferably the same or substantially the same as the dimension of the internal component 3 in the x-axis direction. The strip-shaped sheet member 31a2 extends in the y-axis direction and is positioned between the two adjacent strip-shaped sheet members 31a1 in the x-axis direction when viewed in a plan view in the z-axis direction.

Furthermore, in the present modification, the auxiliary members 31b include a plurality of strip-shaped sheet members 31b1 and at least one strip-shaped sheet member 31b2, as shown in FIG. 8. The strip-shaped sheet members 31b1 and 31b2 preferably have the same or substantially the same size as the auxiliary member 8b using a similar material. The strip-shaped sheet members 31b1 and 31b2 are provided respectively on their corresponding upper principal surfaces of the base sheets 10g and 10h prior to compression bonding. The strip-shaped sheet members 31b1 extend in the x-axis direction and are spaced apart in the y-axis direction. The interval between the strip-shaped sheet members 31b1 is determined by the number of strip-shaped sheet members and other factors, but in the present modification, the interval preferably is the same or substantially the same as the dimension of the internal component 3 in the y-axis direction. The strip-shaped sheet member 31b2 extends in the x-axis direction and is positioned between the two adjacent strip-shaped sheet members 31b1 in the y-axis direction when viewed in a plan view in the z-axis direction.

The base sheet 10c is provided with the uneven portion 9a, which, as with its equivalent described in the preferred embodiment of the present invention described above, includes a wave-shaped configuration when viewed in a plan view in the y-axis direction by the action of the auxiliary members 31a at the time of compression bonding. However, in the present modification, the base sheet 10c is disposed between the strip-shaped sheet members 31a1 and 31a2 on the top and bottom, so that the thickness of the uneven portion 9a in the z-axis direction is larger than in the preferred embodiment of the present invention described above.

Furthermore, the base sheet 10h is provided with the uneven portion 9b, which, as with its equivalent described in the preferred embodiment of the present invention described above, includes a wave-shaped configuration viewed in a plan view in the x-axis direction by the action of the auxiliary members 31b at the time of compression bonding. However, in the present modification, the base sheet 10h is disposed between the strip-shaped sheet members 31b1 and 31b2 on the top and bottom, so that the thickness of the uneven portion 9b in the z-axis direction is larger than in the preferred embodiment of the present invention described above.

The above configuration renders it possible to achieve the same effects as those achieved by the circuit board 1 in the preferred embodiment of the present invention described above.

In the preferred embodiments of the present invention, to prevent the internal component 3 from cracking and also to ensure reliable joints between the internal component 3 and the via-conductors 6, etc., the first portion P1 preferably includes areas inside and around the outline of the internal component 3 when viewed in a top view. However, this is not limiting, and the manufacturer or the like may set any portion of the main portion 2 that is desired to be resistant to deformation, as the first portion P1.

Further, in the preferred embodiments and modifications thereof, the uneven portion 9a preferably extends parallel or substantially parallel to the y-axis, whereas the uneven portion 9b extends along the x-axis. However, this is not limiting, and the directions in which the uneven portions 9a and 9b extend can be set appropriately in accordance with the use and purpose of, for example, the circuit board 1 or 30.

Still further, in the preferred embodiments of the present invention and modifications thereof, the extending directions of the uneven portions 9a and 9b have been described as preferably being perpendicular or substantially perpendicular to each other on the xy plane. However, this is not limiting, and the extending directions define any angle θ such that 0°≤θ≤180°. However, it is preferable that the extending directions of the uneven portions 9a and 9b be perpendicular or substantially perpendicular to each other on the xy plane or cross each other at a perpendicular or substantially perpendicular angle, because they are rendered resistant to deformation by bending moments along both the x- and y-axes.

Yet further, in the preferred embodiments of the present invention and modifications thereof, the main portion 2 preferably includes two uneven portions 9a and 9b. However, this is not limiting, and the main portion 2 may only include at least one uneven portion.

Yet further, the preferred embodiments of the present invention have been described with respect to the example where the internal component 3 preferably is included in the main portion 2. However, the internal component 3 does not have to be incorporated in the main portion 2.

Yet further, the example where an IC chip is preferably used as the internal component 3 has been described, but this is not limiting, and for example, a passive component such as a chip capacitor may be used. Moreover, a functional device such as a sintered ferrite product may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board, comprising:
a main portion including a plurality of base sheets stacked in a predetermined direction;
at least one uneven portion on at least one of the base sheets;
an internal component provided in the main portion; and
an auxiliary member including a strip-shaped sheet member provided between the internal component and one of the plurality of base sheets on which the at least one uneven portion is provided; wherein
the at least one uneven portion includes a concave portion and a convex portion extending in a direction perpendicular or substantially perpendicular to the predetermined direction;
each of the concave portion and convex portion of the at least one uneven potion has a strip-shape when viewed in the predetermined direction;
the concave portion is sunken in the predetermined direction;
the convex portion protrudes in an opposite direction to the predetermined direction;
an outline of the internal component is within an outline of the at least one uneven portion when viewed in a plan view in the predetermined direction;
the at least one uneven portion is located on a side of the one of the plurality of base sheets that is farther away from the internal component in the predetermined direction; and
the auxiliary member overlaps with the convex portion when viewed in the predetermined direction.

2. The circuit board according to claim 1, wherein
the main portion includes two opposite principal surfaces in the predetermined direction; and
a position of the uneven portion in the predetermined direction is closer to the internal component than to one of the principal surfaces.

3. The circuit board according to claim 1, wherein the auxiliary member has a higher softening initiation temperature than the plurality of base sheets.

4. The circuit board according to claim 1, wherein conductors are provided on at least some of the base sheets.

5. The circuit board according to claim 4, further comprising via-conductors extending through the base sheets.

6. The circuit board according to claim 1, wherein the internal component is an IC chip.

7. The circuit board according to claim 1, further comprising a surface mount component that is one of an IC chip and a passive component.

8. A circuit board, comprising:
a main portion including a plurality of base sheets stacked in a predetermined direction;
at least one uneven portion on at least one of the base sheets; and
an internal component provided in the main portion; wherein
the at least one uneven portion includes a concave portion and a convex portion extending in a direction perpendicular or substantially perpendicular to the predetermined direction;
each of the concave portion and convex portion of the at least one uneven potion has a strip-shape when viewed in the predetermined direction;
the concave portion is sunken in the predetermined direction;
the convex portion protrudes in an opposite direction to the predetermined direction;
an outline of the internal component is within an outline of the at least one uneven portion when viewed in a plan view in the predetermined direction;
the at least one uneven portion includes a first uneven portion and a second uneven portion;
the first uneven portion is located on one side of the internal component in the predetermined direction;
the second uneven portion is located on another side of the internal component in the opposite direction to the predetermined direction;
each of the concave portion and the convex portion of the first uneven potion has a strip-shape when viewed in the predetermined direction;
each of the concave portion and the convex portion of the second uneven potion has a strip-shape when viewed in the predetermined direction; and
an extending direction of the concave portion and the convex portion of the first uneven portion is perpendicular or substantially perpendicular to an extending direction of the concave portion and the convex portion of the second uneven portion.

* * * * *